United States Patent [19]

Keswick et al.

[11] Patent Number: 5,132,936
[45] Date of Patent: Jul. 21, 1992

[54] MOS MEMORY CIRCUIT WITH FAST ACCESS TIME

[75] Inventors: Paul D. Keswick; James M. Apland, both of San Jose, Calif.

[73] Assignee: Cypress Semiconductor Corporation, San Jose, Calif.

[21] Appl. No.: 675,021

[22] Filed: Mar. 25, 1991

Related U.S. Application Data

[63] Continuation of Ser. No. 450,416, Dec. 14, 1989, abandoned.

[51] Int. Cl.$^5$ ............................................. G11C 11/401
[52] U.S. Cl. .............................. 365/189.06; 365/203; 365/204; 365/230.06; 307/296.6; 307/296.8; 307/567; 307/568; 323/313
[58] Field of Search .................. 307/296.6, 296.8, 567, 307/568; 323/313; 365/203, 204, 189.06, 230.06

[56] References Cited

U.S. PATENT DOCUMENTS

| 3,942,160 | 3/1976 | Yu | 365/204 |
|---|---|---|---|
| 4,100,437 | 7/1978 | Hoff | 307/296.8 |
| 4,185,321 | 1/1980 | Iwahashi et al. | 365/204 |
| 4,388,537 | 6/1983 | Kanuma | 307/296.6 |
| 4,464,590 | 8/1984 | Rapp | 307/568 |
| 4,473,762 | 9/1984 | Iwahashi et al. | 307/296.6 |
| 4,516,224 | 5/1985 | Aoyama | 365/204 |
| 4,901,280 | 2/1990 | Patel | 365/203 |
| 4,905,197 | 2/1990 | Urai | 365/204 |
| 4,939,385 | 7/1990 | Dubujet | 307/296.8 |
| 4,984,256 | 1/1991 | Imai | 307/296.6 |

FOREIGN PATENT DOCUMENTS

| 60-61995 | 4/1985 | Japan | 365/204 |
|---|---|---|---|
| 60-136996 | 7/1985 | Japan | 365/204 |

Primary Examiner—Joseph E. Clawson, Jr.
Attorney, Agent, or Firm—Roger S. Borovoy

[57] ABSTRACT

An improved MOS memory circuit using an MOS clamp circuit on the bitlines which turns on when the voltage on a bitline exceeds a predetermined voltage, thereby drawing current from the bitline to remove excess charge and return the bitline to the predetermined voltage. The clamp circuit of this invention allows prompt read access because reading is not substantially delayed by the excess bitline charge.

26 Claims, 2 Drawing Sheets

MOS MEMORY CIRCUIT WITH FAST ACCESS TIME

This is a continuation of application Ser. No. 450,416 filed Dec. 14, 1989 now abandoned.

BACKGROUND OF THE INVENTION AND PRIOR ART

The present invention relates to an improved memory device providing a faster read access time. MOS semiconductor memory devices of various types, such as random access memories (RAMs), read-only memories (ROMs), programmable read-only memories (PROMs), erasable programmable read-only memories (EPROMs), electrically erasable programmable read-only memories (EEPROMs) and first-in, first-out memories (FIFOs) are all well known in the art. Data is stored in these memories during a "write" cycle, and that data is subsequently read during a "read" cycle. These memories are typically used in computers such as desk and lap top personal computers, as well as many other industrial applications. As the chip technology improves, and central processing units (CPUs) become available with higher and higher processing speeds, the time it takes to read data from the semiconductor memories becomes a critical factor in the system. It is desirable to keep this read time, called an "access time" to a minimum.

Reading and writing into a semiconductor memory is usually done through a "bitline". As semiconductor technology has improved, semiconductor memories have gotten denser and denser. At the present time, most dynamic RAMs used in personal computers contain approximately one million bits, and are thus called "one megabit" dynamic RAMs (or DRAMs). The current generation of static RAMs (SRAMs) contain approximately 64,000 or 256,000 bits, and are called 64K SRAMs or 256K SRAMs, respectively. ROMs and EPROMs are also available commercially in 256K and 1 megabit densities.

When semiconductor memories are read, a technique commonly employed is to precharge the bitlines. That means the bitlines are brought up to a particular precharge voltage so that a predetermined amount of charge appears on a bitline which is to be read. As these arrays get denser and denser, there are more and more individual memory cells on a single bitline. This causes the total bitline capacitance to become quite large, for example, one picofarad or more.

It therefore becomes very important during reading that the power supply voltage, the difference between the positive power supply $V_{cc}$, typically 5 volts, and the negative power supply $V_{ss}$, typically ground, remain constant at 5 volts. If there is a voltage spike causing $V_{cc}$ to rise somewhat (commonly called a voltage bump), and the ground voltage doesn't rise simultaneously, the power supply voltage becomes greater than 5 volts. Obviously if the ground voltage (called a ground "bounce") also rises in tandem with $V_{cc}$, there is no problem since the differential between the positive power supply terminal $V_{cc}$ and the negative power supply terminal $V_{ss}$ will still remain at 5 volts. However, when these two phenomenon do not occur simultaneously, and only $V_{cc}$ is bumped, charge can become trapped onto the bitlines as a result of this higher power supply voltage.

This additional charge causes a problem during a read operation when two bitlines are compared. The selected bitline is pulled down and is compared with another which remains high. If the excess charge isn't removed, on the bitline which is pulled down, reading cannot take place and is delayed. This excess charge must be eliminated before the voltages on the two bitlines will be sufficiently separated for reading to take place.

The conventional apparatus used to read a semiconductor memory will delay a read operation until the relative charge on the selected bitline compared to another is in the predetermined correct range. However, while the reading apparatus is waiting for the trapped charge to dissipate, the read operation will be delayed and a penalty paid in access time—a very important device parameter.

During precharge, the selected bitline is typically pulled to $V_{cc} - V_t$. If there is excess charge on this bitline, it is pulled to a higher voltage than necessary. Before the read apparatus will do a read and obtain valid data, there must be a predetermined delta, for example about 60 millivolts, between the bitlines. Excess charge on the bitlines will result in a delay in creating this predetermined voltage difference, and therefore, a delay in the read access time. If the correct voltage differential does not exist, the read apparatus delays the read.

To speed the dissipation of this excess charge on the selected bitlines, prior art techniques employ an "active leaker" transistor. Such a leaker transistor is tied between the bitline and ground. Where there is excess charge on the bitline, the charge leaks off through this active leaker transistor which is always turned on. Once the excess charge has leaked, the bitline can be read.

The problem with this prior art solution is that maintaining the active leaker transistor always in the on condition causes a continuous power drain on the circuit, often several milliamps. For example, in a memory circuit with eight input-output lines, there must be two leaker transistors for each input-output, one for the "true" line and one for the "complement" line. In "split array" architectures with nine input/output lines, thirty-six leakers are commonly employed, eighteen for the left half array and eighteen for the right half array. It is easy to understand that this places a tremendous power drain on the circuit. Since many of these circuits are used in portable applications, power drain is extremely undesirable because battery requirements, and thus weight goes up in proportion to the amount of power required by the memory circuits.

One approach for getting rid of this power drain from the leaker transistors uses a clocking circuit to only turn on the leaker transistors when they were necessary during a read cycle. The problem with this solution is that very precise clock timing is required, and the design of a clock with the requisite precision is difficult. If the clock timing is cut too close, access time will be delayed because the leaker will be turned off too soon before all of the necessary charge has been dissipated. If the clock cycle is made too wide the leaker remains on too long and too much power is burned.

The inventors of the subject invention discovered that a clamp circuit could be used in place of a leaker transistor to dissipate the excess bitline charge. The clamp circuit is an MOS transistor having its gate tied to a source of clamping voltage and its source-drain circuit in series with the bitline and ground. The advantage of this clamp circuit is that it is only turned on by the existence of excess charge in the bitline, and otherwise it remains off. Accordingly, there is no power drain in the bitline circuits except when charge trapping occurs, which is precisely when the clamp is necessary. In the absence of excess bitline charge, the clamp circuit always remains off.

Prior to this invention, a clamp circuit was considered an undesirable solution. In the memory circuits used in the preferred embodiment of the invention, each clamp circuit uses two transistors, and there must be one clamp circuit on each input-output line in the same manner as a leaker transistor had been employed in the prior art. Accordingly, this meant that bitline charge dissipation would require twice as many transistors as had been required using the prior art leaker solution, causing a penalty in chip area. Therefore, the clock solution, which would take far fewer transistors because all of the leakers (for example 36) could be clocked with the same clock devices, was considered a better solution.

BRIEF DESCRIPTION OF THE INVENTION

The improved MOS memory circuit a clamp circuit, including an MOS clamp transistor, the input of which is coupled to one of the bitlines of the memory. A clamping reference voltage is applied to the gate of the clamp transistor and the clamp circuit is coupled to a point of fixed potential. When the voltage on the bitline to which the clamp is attached exceeds a predetermined voltage, the clamp circuit turns on, thereby drawing current from that bitline and returning the bitline voltage to a voltage equal to the predetermined voltage, thereby allowing prompt read access which is not delayed by the bitline voltage exceeding the predetermined voltage.

In a preferred embodiment of the invention, the clamp circuit includes one MOS transistor of one polarity type and another MOS transistor in series with the first transistor of the opposite polarity type. Preferably the clamping voltage is set equal to the power supply voltage $V_{cc}$ less the combined threshold voltages of a p-channel and an n-channel transistor.

DETAILED DESCRIPTION OF THE INVENTION

Figure 1:
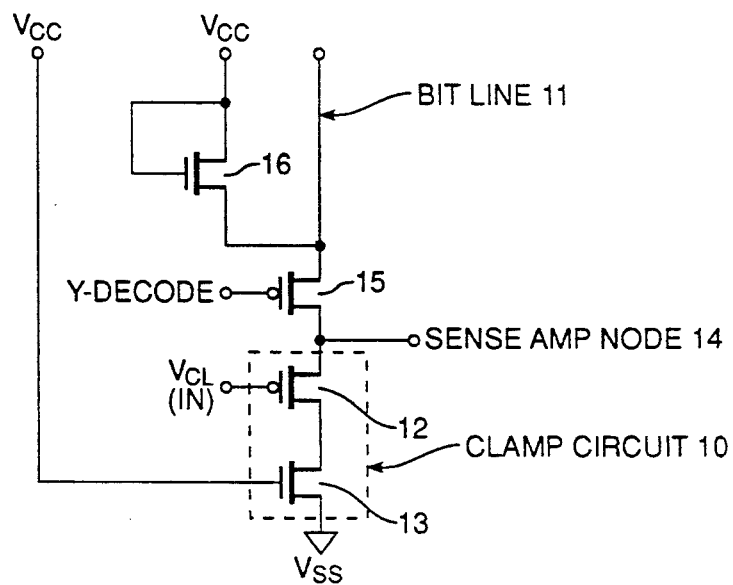
FIG. 1 is a schematic circuit diagram of the improved memory circuit of a preferred embodiment of this invention.

Referring to the drawings and in particular to FIG. 1, clamp circuit 10 is connected in series with bitline 11. Clamp circuit 10 is made up of p-channel MOS transistor 12 in series with n-channel MOS transistor 13. Clamp circuit 10 is coupled between the sense amplifier node 14 and ground ($V_{ss}$). A clamping voltage $V_{c1}$, generated in a manner to be described later, is connected to the gate of p-channel transistor 12. P-channel Y-decode transistor 15 is used to select bitline 11 for read access.

N-channel MOS transistor 13 has its drain connected to the drain of p-channel transistor 12 and its source connected to ground. The gate of n-channel transistor 13 is connected, as shown, to $V_{cc}$. N-channel transistor 13 operates in a similar manner to a leaker transistor, but as will be apparent, it is only active when p-channel clamp transistor 12 is on, as will be described below.

The clamping voltage $V_{c1}$ on the gate of transistor 12 assures that if the bitline 11 is at its normal precharge value, which is equal to $V_{cc}-V_{tn}$ or lower, the clamping voltage at the gate of transistor 12 will ensure that transistor 12 is off. $V_{tn}$ is the threshold voltage of an n-channel MOS transistor. This is accomplished by setting the clamping voltage $V_{c1}$ at a voltage equal to $V_{cc}-V_{tn}$ — the absolute value of $V_{tp}$ (/$V_{tp}$/), or $V_{cc}-V_{tn}-/V_{tp}/$. $V_{tp}$ is the threshold voltage of a p-channel MOS transistor.

When there is excess charge on bitline 11, the voltage at the drain of Y-decode transistor 15 coupled to the source of clamp transistor 12 is above ($V_{cc}-V_{tn}$). Since the voltage at the gate of transistor 12 is $V_{cc}-V_{tn}-/V_{tp}/$, which is less than the voltage on its drain by more than $V_{tp}$, p-channel transistor 12 turns on, allowing the excess charge to drain through normally on n-channel transistor 13 to ground. Even though transistor 13 is normally on, there is very little leakage through this transistor except when required for bitline charge drain because clamp transistor 12 is normally off except in conditions of excess bitline charge. The bitline 11 is normally maintained at its precharge voltage of $V_{cc}-V_{tn}$ as a result of the single threshold drop $V_{tn}$ of the n-channel pull-up transistor 16 coupled between $V_{cc}$ and the bitline.

Figure 2:
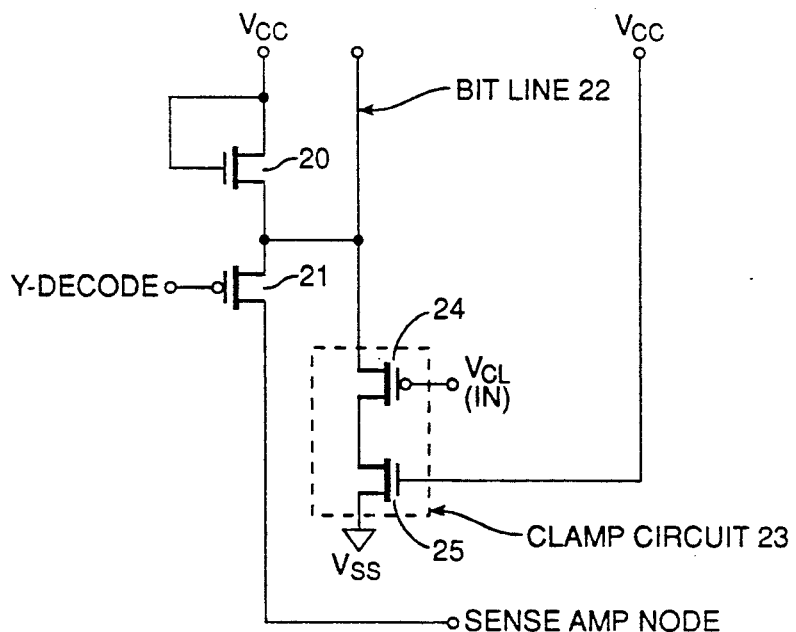
FIG. 2 is a schematic circuit diagram of the improved memory circuit of another embodiment of this invention.

Another embodiment of the invention is shown in FIG. 2. The circuit of FIG. 2 operates in essentially the same manner as the circuit of FIG. 1, but the clamp circuit 23 is connected differently. N-channel transistor 20 performs the same function as transistor 16 in FIG. 1. P-channel Y-decode transistor 21 performs its normal function of selecting bitline 22 for a read operation. Clamp circuit 23 operates in the same manner as clamp circuit 10 in the embodiment of FIG. 1. When excess charge appears on bitline 22, p-channel transistor 24 turns on and discharges the extra charge through normally on n-channel transistor 25.

The disadvantage of the circuit of this embodiment shown in FIG. 2 over the preferred embodiment shown in FIG. 1 is that one clamp circuit 23 is required for each bitline. Since there are normally far more bitlines (for example one hundred forty-four) than there are input-output lines (for example thirty-six), a significant saving in transistor count can be achieved by using the embodiment of FIG. 1, which only requires a single clamp circuit for each input-output line instead of one for each bitline.

Figure 3:
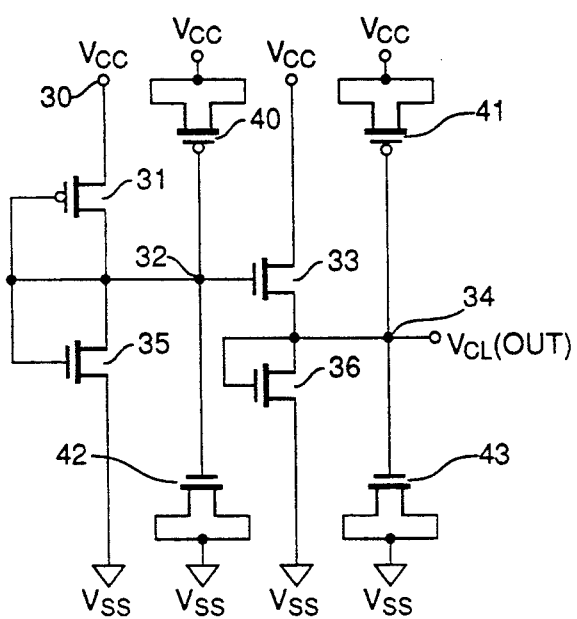
FIG. 3 is a preferred embodiment of the clamping voltage generator of the invention.

The clamping voltage may be generated using the circuit of a preferred embodiment of the invention shown in FIG. 3. The five volt power supply voltage $V_{cc}$ is applied at terminal 30. As it passes through p-channel transistor 31, its value is dropped by one p-channel threshold voltage $V_{tp}$. The voltage at node 32 is therefore approximately $V_{cc}-/V_{tp}/$. This voltage $V_{cc}-/V_{tp}/$ is then passed through n-channel transistor 33, reducing it again by the threshold voltage of the n-channel transistor $V_{tn}$. Therefore the voltage at node 34, which is $V_{c1}$, is approximately equal to $V_{cc}-/V_{tp}/-V_{tn}$. This neglects the voltage divider effects of transistor pairs 31, 35 and 33, 36.

Transistors 35 and 36 are used to provide sufficient leakage current to maintain the sources of p-channel transistor 31, connected to node 32, and n-channel transistor 33, connected to node 34, respectively, at their correct voltages. Transistors 35 and 36 thus ensure that transistors 31 and 33 remain on. Transistors 40, 41, 42 and 43 each have their sources and drains connected together. The connected sources and drains of transistors 40 and 41 are connected to $V_{cc}$, and the connected sources and drains of transistors 42 and 43 are connected to $V_{ss}$. These four capacitors are used primarily to ensure, during initial power up conditions, that transistors 31 and 33 come up to the correct voltage at power on. This is achieved by carefully selecting the capacitive ratios of the respective capacitor pairs 40, 42 and 41, 43. If these ratios are correctly chosen, as is known in the art, the voltages at nodes 32 and 34 will reach the desired voltages, $V_{cc}-/V_{tp}/$ and $V_{cc}-/V_{tp}/-V_{tn}$, respectively, under nominal operating conditions. These capacitors also, in the case of a $V_{cc}$ bump or a ground bounce, will maintain the voltages between their gates (at nodes 32 and 34) at a stable level in spite of these voltage disturbances.

Referring now to FIGS. 1 and 2, the improved memory circuit of the invention will draw a small amount of steady-state current through transistors 13 and 25 because of the voltage divider effect of transistor pairs 31, 35 and 33, 36 as shown in FIG. 3. However, this leakage current is about two orders of magnitude less, in a worst case condition, than the standby current which would be drawn by the leaker transistors of the memory circuit of the prior art. Furthermore, prior art memory circuits using leaker transistors which, when operated at a low $V_{cc}$ and a high temperature, are maximally resistive due to decreased device mobility. Thus they are least effective under the conditions at which the read access would be worst. On the other hand, leakers are least resistive at low temperature and high $V_{cc}$, due to increased mobility, causing high power consumption. Thus the circuit designer is caught in a power, speed trade off with respect to the prior art leaker transistors. Large leakers consume too much power at low temperatures and high $V_{cc}$ while small leakers draw off excess charge too slowly at high temperatures and low $V_{cc}$.

To the contrary, using the improved memory circuit of the invention having a clamp circuit instead of leakers, because the clamp is normally off, the circuit can be optimized by using larger transistors in the clamp circuit to effectively drain the excess charge at low $V_{cc}$ and high temperature conditions, thus maintaining short access time, and yet, at high $V_{cc}$ and low temperature, the circuit still draws very little power. This combination represents a significant access time advantage over the prior art, often as much as five nanoseconds, the circuit of the invention is particularly useful in memories with many memory cells on each bitline.

Still a further advantage is derived because the clamping voltage $V_{cl}$, based on $V_{tn}$ and $V_{tp}$, can track process and temperature shifts of threshold voltages $V_t$, yet still provide the proper clamping voltage in spite of these shifts. In other words, as the threshold voltages of the other active devices in the circuit shift because of process or temperature variations, the circuit generating the clamping voltage, based on the same transistor threshold parameters, will shift along with these other active devices and provide the necessary tracking.

Many improvements and changes can be made in the embodiments of the invention described above without departing from the scope of the invention, which should be limited only as set forth in the claims which follow.

We claim:

1. In an MOS memory circuit having a plurality of bit lines which are precharged prior to access which are accessed for reading and writing, and where read access is delayed whenever a bitline being read is charged to a voltage which exceeds a predetermined voltage, the improvement comprising a clamp circuit coupled to one of said bitlines, said clamp circuit including an MOS clamp transistor, a clamping reference voltage coupled to the gate of said MOS clamp transistor, means for setting said clamping reference voltage to a fixed level such that when said bitline voltage drops below its normal precharge value, the clamping reference voltage will insure that said MOS clamp transistor is off, but when said bitline voltage rises above said normal precharge value, said MOS clamp transistor is turned on, said clamp circuit being coupled to a point of fixed potential, whereby when the voltage on said one bitline exceeds said predetermined voltage, said clamp circuit is turned on, thereby drawing current from said bitline and returning said bitline voltage to said predetermined voltage, thereby allowing prompt read access.

2. The improvement in an MOS memory circuit of claim 1 further characterized by said clamp circuit including a second MOS transistor having one of its source and drain terminals coupled to said clamp transistor and the other of said source and drain terminals coupled to said point of fixed potential.

3. The improvement in an MOS memory circuit of claim 2 further characterized by said clamp transistor being of one polarity type and said second MOS transistor being of the opposite polarity type.

4. The improvement in an MOS memory circuit of claim 3 further characterized by said clamp transistor being p-channel and said second MOS transistor being n-channel.

5. The improvement in an MOS memory circuit of claim 1 further characterized by the inclusion of a means for providing a supply voltage to said memory circuit, said clamping reference voltage being equal to the supply voltage less the combined threshold voltages of a p-channel transistor and an n-channel transistor.

6. In an MOS memory circuit having a plurality of bit lines which are precharged prior to access, which are accessed for reading and writing, and where read access is delayed whenever a bitline being read is charged to a voltage which exceeds a predetermined voltage, each bitline including an MOS bitline selection transistor which is turned on when said bitline is selected, the improvement comprising a clamp circuit coupled to one of said bitlines, said clamp circuit including an MOS clamp transistor, a clamping reference voltage coupled to the gate of said MOS clamp transistor, means for setting said clamping reference voltage to a fixed level such that when said bitline voltage drops below its normal precharge value, the clamping reference voltage will insure that said MOS clamp transistor is off, but when said bitline voltage rises above said normal precharge value, said MOS clamp transistor is turned on, said clamp circuit being coupled to a point of fixed potential, whereby when the voltage on a selected bitline exceeds said predetermined voltage, said clamp circuit is turned on, thereby drawing current from said bitline and returning said bitline voltage to said predetermined voltage, thereby allowing prompt read access.

7. The improvement in an MOS memory circuit of claim 6 further characterized by said clamp circuit including a second MOS transistor having one of its source and drain terminals coupled to said clamp transistor and the other of said source and drain terminals coupled to said point of fixed potential.

8. The improvement in an MOS memory circuit of claim 7 further characterized by said clamp transistor being of one polarity type and said second MOS transistor being of the opposite polarity type.

9. The improvement in the MOS memory circuit of claim 8 further characterized by said clamp transistor being p-channel and said second MOS transistor being n-channel.

10. The improvement, in the MOS memory circuit of claim 6 further characterized by the inclusion of a means for providing a supply voltage to said memory circuit, said clamping reference voltage being equal to the supply voltage less the combined threshold voltages of a p-channel transistor and an n-channel transistor.

11. In an MOS memory circuit having a plurality of bit lines which are precharged prior to access, which are accessed for reading and writing, where read access is delayed whenever a bitline being read is charged to a voltage which exceeds a predetermined voltage, each bitline including an MOS bitline selection transistor which is turned on when said bit line is selected, the improvement comprising a clamp circuit which is coupled to said bitline irrespective of whether said bitline is selected by said selection transistor, said clamp circuit including an MOS clamp transistor, a clamping reference voltage being coupled to the gate of said MOS clamp transistor, means for setting said clamping voltage reference to a fixed level such that when said bitline voltage drops below its normal precharge value, the clamping reference voltage will insure that said MOS clamp transistor is off, but when said bitline voltage rises above said normal precharge value, said MOS clamp transistor is turned on, said clamp circuit being coupled to a point of fixed potential, whereby when the voltage on a selected bitline exceeds said predetermined voltage, said clamp circuit is turned on, thereby drawing current from said bitline and returning said bitline voltage to said predetermined voltage, thereby allowing prompt read access.

12. The improvement in an MOS memory circuit of claim 11 further characterized by said clamp circuit including a second MOS transistor having one of its source and drain terminals coupled to said clamp transistor and the other of said source and drain terminals coupled to said point of fixed potential.

13. The improvement in an MOS memory circuit of claim 12 further characterized by said clamp transistor being of one polarity type and said second MOS transistor being of the opposite polarity type.

14. The improvement in the MOS memory circuit of claim 13 further characterized by said clamp transistor being p-channel and said second MOS transistor being n-channel.

15. The improvement in the MOS memory circuit of claim 11 further characterized by the inclusion of a means for providing a supply voltage to said memory circuit, said clamping reference voltage being equal to the supply voltage less the combined threshold voltages of a p-channel transistor and an n-channel transistor.

16. In an MOS memory circuit having a plurality of bit lines which are precharged prior to access, which are accessed for reading and writing, and where read access is delayed whenever a bitline being read is charged to a voltage which exceeds a predetermined voltage, the improvement comprising a clamp circuit coupled to one of said bitlines, said clamp circuit including an MOS clamp transistor, a means for generating a fixed clamping reference voltage coupled to the gate of said MOS clamp transistor, said clamping reference voltage generating means including series-coupled p-channel and n-channel MOS transistors, said series-coupled transistors coupled between one terminal of the power supply to said memory circuit and the clamping reference voltage input of said clamp circuit, said clamp circuit also being coupled to the other power supply terminal, whereby when the voltage on said one bitline exceeds said predetermined voltage, said clamp circuit is turned on, thereby drawing current from said bitline and returning said bitline voltage to said predetermined voltage, thereby allowing prompt read access.

17. The improvement in an MOS memory circuit of claim 16 further characterized by said clamp circuit including a second MOS transistor having one of its source and drain terminals coupled to said clamp transistor and the other of said source and drain terminals coupled to said other power supply terminal.

18. The improvement in an MOS memory circuit of claim 17 further characterized by said clamp transistor being of one polarity type and said second MOS transistor being of the opposite polarity type.

19. The improvement in the MOS memory circuit of claim 18 further characterized by said clamp transistor being p-channel and said second MOS transistor being n-channel.

20. The improvement in the MOS memory circuit of claim 16 further characterized by said clamping reference voltage being by said series-coupled transistors equal to the supply voltage less the combined threshold voltages of a p-channel transistor and an n-channel transistor.

21. The apparatus of claim 1 wherein said means for setting said clamping reference voltage comprises:
a first CMOS circuit including an N-channel MOS transistor and a P-channel MOS transistor, one of said transistors being coupled to a source of fixed potential, said first CMOS circuit providing at its output the voltage of said source of fixed potential less the threshold voltage of said MOS transistor coupled to said source of fixed potential; and
a second MOS circuit having its input coupled to the output of said first CMOS circuit, said second MOS circuit including a first MOS transistor and a second MOS transistor, said first MOS transistor being coupled to a source of fixed potential, said second MOS circuit providing at its output the voltage of said source of fixed potential less the threshold voltage of the MOS transistor of said first CMOS circuit which is coupled to said source of fixed potential less the threshold voltage of said first MOS transistor of said second MOS circuit, the output of said second MOS circuit being said clamping reference voltage.

22. The apparatus of claim 6 wherein said clamping reference voltage is supplied by a circuit comprising:
a first CMOS circuit including an N-channel MOS transistor and a P-channel MOS transistor, one of said transistors being coupled to a source of fixed potential, said first CMOS circuit providing at its output the voltage of said source of fixed potential less the threshold voltage of said MOS transistor coupled to said source of fixed potential; and
a second MOS circuit having its input coupled to the output of said first CMOS circuit, said second MOS circuit including a first MOS transistor and a second MOS transistor, said first MOS transistor being coupled to a source of fixed potential, said second MOS circuit providing at its output the voltage of said source of fixed potential less the threshold voltage of the MOS transistor of said first CMOS circuit which is coupled to said source of fixed potential less the threshold voltage of said first MOS transistor of said second MOS circuit, the output of said second MOS circuit being said clamping reference voltage.

23. The apparatus of claim 11 wherein said means for setting said clamping reference voltage comprises:
 a first CMOS circuit including an N-channel MOS transistor and a P-channel MOS transistor, one of said transistors being coupled to a source of fixed potential, said first CMOS circuit providing at its output the voltage of said source of fixed potential less the threshold voltage of said MOS transistor coupled to said source of fixed potential; and
 a second MOS circuit having its input coupled to the output of said first CMOS circuit, said second MOS circuit including a first MOS transistor and a second MOS transistor, said first MOS transistor being coupled to a source of fixed potential, said second MOS circuit providing at its output the voltage of said source of fixed potential less the threshold voltage of the MOS transistor of said first CMOS circuit which is coupled to said source of fixed potential less the threshold voltage of said first MOS transistor of said second MOS circuit, the output of said second MOS circuit being said clamping reference voltage.

24. Apparatus for supplying a clamping reference voltage comprising:
 a first CMOS circuit including an N-channel MOS transistor and a P-channel MOS transistor, one of said transistors being coupled to a source of fixed potential, said first CMOS circuit providing at its output the voltage of said source of fixed potential less the threshold voltage of said MOS transistor coupled to said source of fixed potential; and
 a second MOS circuit having its input coupled to the output of said first CMOS circuit, said second MOS circuit including a first N-channel MOS transistor and a second N-channel MOS transistor, said first N-channel MOS transistor being coupled to a source of fixed potential, said second MOS circuit providing at its output the voltage of said source of fixed potential less the threshold voltage of the MOS transistor of said first CMOS circuit which is coupled to said source of fixed potential less the threshold voltage of said first N-channel MOS transistor of said second MOS circuit, the output of said second MOS circuit being said clamping reference voltage.

25. The apparatus of claim 24 wherein the P-channel MOS transistor of said first CMOS circuit is the transistor which is coupled to said source of fixed potential.

26. The apparatus of claim 24 wherein the outputs of said first and second circuits are also coupled to capacitors, whereby, during initial power up conditions, the transistors of said first and second circuits which are coupled to said source of fixed potential will come up to the correct voltage.

* * * * *